(12) United States Patent
Muto et al.

(10) Patent No.: US 9,202,314 B2
(45) Date of Patent: Dec. 1, 2015

(54) HEXAHEDRAL MESH GENERATOR

(71) Applicant: Hitachi, Ltd., Chiyoda-ku, Tokyo (JP)

(72) Inventors: Kazuo Muto, Tokyo (JP); Ichiro Kataoka, Tokyo (JP); Masayuki Hariya, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 195 days.

(21) Appl. No.: 13/950,866

(22) Filed: Jul. 25, 2013

(65) Prior Publication Data

US 2014/0035809 A1   Feb. 6, 2014

(30) Foreign Application Priority Data

Jul. 31, 2012   (JP) .................. 2012-169384

(51) Int. Cl.
| | | |
|---|---|---|
| *G06T 17/00* | (2006.01) | |
| *G06T 19/20* | (2011.01) | |
| *G06T 17/10* | (2006.01) | |
| *G06T 17/20* | (2006.01) | |
| *G06F 17/50* | (2006.01) | |

(52) U.S. Cl.
CPC ................. *G06T 19/20* (2013.01); *G06T 17/10* (2013.01); *G06T 17/20* (2013.01); *G06F 17/5018* (2013.01); *G06T 2219/2008* (2013.01)

(58) Field of Classification Search
CPC .................................................. G06F 17/5018
See application file for complete search history.

(56) References Cited

U.S. PATENT DOCUMENTS

| | | | |
|---|---|---|---|
| 5,768,156 A * | 6/1998 | Tautges et al. .................... 703/2 |
| 2011/0037763 A1 * | 2/2011 | Lee et al. ...................... 345/419 |

FOREIGN PATENT DOCUMENTS

| | | |
|---|---|---|
| JP | 2003-108609 A | 4/2003 |
| JP | 2003-132099 A | 5/2003 |
| JP | 2007-122205 A | 5/2007 |

OTHER PUBLICATIONS

Robert Schneiders, Algorithms for Quadrilateral and Hexahedral Mesh Generation, Dec. 2000, Proceedings of the VKI lecture series on computational fluid dynamics, pp. 1-56.*
Hiroshi Sakurai, Volume decomposition and feature recognition: Part 1—polyhedral objects, Dec. 1995, Computer-Aided Design, vol. 27, No. 11, pp. 833-843.*

* cited by examiner

*Primary Examiner* — Stephen R Koziol
*Assistant Examiner* — Robert Craddock
(74) *Attorney, Agent, or Firm* — Crowell & Moring LLP

(57) ABSTRACT

A hexahedral mesh generator for an analysis model generation target includes an existing analysis model database that stores shape data of existing analysis models before and after shape decomposition, a shape decomposition part extracting module that compares the shapes existing analysis models before and after the shape decomposition, a shape comparison module that compares each shape decomposition part with the analysis model generation target and checks whether the shape decomposition part coincides with at least part of the analysis model generation target, a coinciding shape decomposition part display/selection module that displays coinciding shape decomposition parts and outputs shape decomposition parts selected by the user, a shape decomposition module that decomposes the shape of the analysis model generation target in the same way as the outputted shape decomposition parts, and a hexahedral mesh generating module that generates the hexahedral mesh for the analysis model generation target after undergoing the shape decomposition.

4 Claims, 16 Drawing Sheets

FIG. 8
EXISTING ANALYSIS MODEL
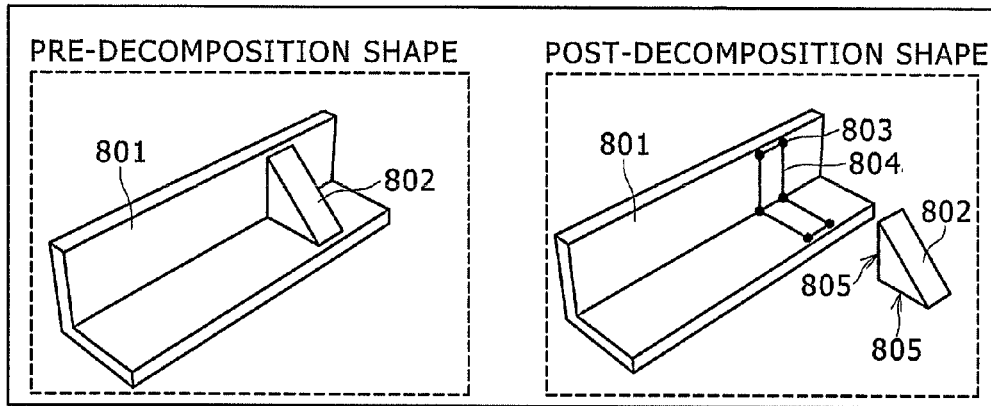
EXTRACTED SHAPE DECOMPOSITION PART
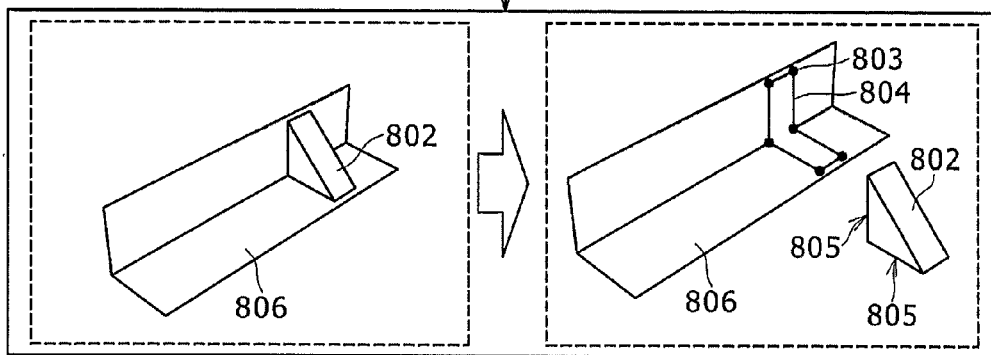

FIG.10

IDENTIFIERS OF
FACES OF SHAPE
DECOMPOSITION PART

|   | 1 | 2 | 3 | 4 | 5 |
|---|---|---|---|---|---|
| 1 | 0 | 1 | 1 | 1 | 1 |
| 2 | 1 | 0 | 1 | 1 | 1 |
| 3 | 1 | 1 | 0 | 1 | 0 |
| 4 | 1 | 1 | 1 | 0 | 1 |
| 5 | 1 | 1 | 0 | 1 | 0 |

IDENTIFIERS OF
FACES OF SHAPE
DECOMPOSITION PART

FIG.11

IDENTIFIERS OF FACES OF ANALYSIS MODEL GENERATION TARGET

IDENTIFIERS OF FACES OF ANALYSIS MODEL GENERATION TARGET

|    | 1 | 2 | 3 | 4 | 5 | 6 | 7 | 8 | 9 | 10 | 11 | 12 | 13 | 14 | 15 | 16 |
|----|---|---|---|---|---|---|---|---|---|----|----|----|----|----|----|----|
| 1  | 0 | 1 | 1 | 1 | 1 | 1 | 1 | 0 | 0 | 0  | 0  | 0  | 0  | 0  | 0  | 0  |
| 2  | 1 | 0 | 1 | 0 | 0 | 0 | 1 | 1 | 0 | 0  | 0  | 0  | 0  | 0  | 0  | 0  |
| 3  | 1 | 1 | 0 | 1 | 0 | 0 | 0 | 1 | 1 | 1  | 1  | 0  | 0  | 0  | 0  | 0  |
| 4  | 1 | 0 | 1 | 0 | 1 | 0 | 0 | 1 | 1 | 1  | 1  | 1  | 0  | 1  | 1  | 1  |
| 5  | 1 | 0 | 0 | 1 | 0 | 1 | 0 | 1 | 0 | 0  | 0  | 0  | 0  | 0  | 0  | 0  |
| 6  | 1 | 0 | 0 | 0 | 1 | 0 | 1 | 1 | 0 | 0  | 0  | 0  | 0  | 0  | 0  | 0  |
| 7  | 1 | 1 | 0 | 0 | 0 | 1 | 0 | 1 | 0 | 0  | 0  | 0  | 0  | 0  | 0  | 0  |
| 8  | 0 | 1 | 1 | 1 | 1 | 1 | 1 | 0 | 0 | 0  | 0  | 0  | 0  | 0  | 0  | 0  |
| 9  | 0 | 0 | 1 | 1 | 0 | 0 | 0 | 0 | 0 | 1  | 0  | 0  | 0  | 0  | 0  | 0  |
| 10 | 0 | 0 | 1 | 1 | 0 | 0 | 0 | 0 | 1 | 0  | 1  | 0  | 0  | 0  | 0  | 0  |
| 11 | 0 | 0 | 1 | 1 | 0 | 0 | 0 | 0 | 0 | 1  | 0  | 0  | 0  | 0  | 0  | 0  |
| 12 | 0 | 0 | 0 | 1 | 0 | 0 | 0 | 0 | 0 | 0  | 0  | 0  | 1  | 1  | 1  | 0  |
| 13 | 0 | 0 | 0 | 1 | 0 | 0 | 0 | 0 | 0 | 0  | 0  | 1  | 0  | 1  | 0  | 1  |
| 14 | 0 | 0 | 0 | 0 | 0 | 0 | 0 | 0 | 0 | 0  | 0  | 1  | 1  | 0  | 1  | 1  |
| 15 | 0 | 0 | 0 | 1 | 0 | 0 | 0 | 0 | 0 | 0  | 0  | 1  | 0  | 1  | 0  | 1  |
| 16 | 0 | 0 | 0 | 1 | 0 | 0 | 0 | 0 | 0 | 0  | 0  | 0  | 1  | 1  | 1  | 0  |

FIG.12

IDENTIFIERS OF FACES OF ANALYSIS MODEL GENERATION TARGET

IDENTIFIERS OF FACES OF ANALYSIS MODEL GENERATION TARGET

|    | 1 | 2 | 3 | 4 | 5 | 6 | 7 | 8 | 9 | 10 | 11 | 12 | 13 | 14 | 15 | 16 |
|----|---|---|---|---|---|---|---|---|---|----|----|----|----|----|----|----|
| 1  | 0 | 1 | 1 | 1 | 1 | 0 | 1 | 1 | 0 | 0  | 0  | 0  | 0  | 0  | 0  | 0  |
| 2  | 1 | 0 | 0 | 0 | 1 | 1 | 1 | 0 | 0 | 0  | 0  | 0  | 0  | 0  | 0  | 0  |
| 3  | 1 | 0 | 0 | 1 | 0 | 1 | 0 | 1 | 0 | 0  | 0  | 0  | 0  | 0  | 0  | 0  |
| 4  | 1 | 0 | 1 | 0 | 1 | 1 | 0 | 0 | 0 | 0  | 0  | 0  | 0  | 0  | 0  | 0  |
| 5  | 1 | 1 | 0 | 1 | 0 | 1 | 0 | 0 | 0 | 0  | 0  | 0  | 0  | 0  | 0  | 0  |
| 6  | 0 | 1 | 1 | 1 | 1 | 0 | 1 | 1 | 0 | 0  | 0  | 0  | 0  | 0  | 0  | 0  |
| 7  | 1 | 1 | 0 | 0 | 0 | 1 | 0 | 1 | 1 | 1  | 1  | 0  | 0  | 0  | 0  | 0  |
| 8  | 1 | 0 | 1 | 0 | 0 | 1 | 1 | 0 | 1 | 1  | 1  | 1  | 1  | 0  | 1  | 1  |
| 9  | 0 | 0 | 0 | 0 | 0 | 0 | 1 | 1 | 0 | 1  | 0  | 0  | 0  | 0  | 0  | 0  |
| 10 | 0 | 0 | 0 | 0 | 0 | 0 | 1 | 1 | 1 | 0  | 1  | 0  | 0  | 0  | 0  | 0  |
| 11 | 0 | 0 | 0 | 0 | 0 | 0 | 1 | 1 | 0 | 1  | 0  | 0  | 0  | 0  | 0  | 0  |
| 12 | 0 | 0 | 0 | 0 | 0 | 0 | 0 | 1 | 0 | 0  | 0  | 0  | 1  | 1  | 1  | 0  |
| 13 | 0 | 0 | 0 | 0 | 0 | 0 | 0 | 1 | 0 | 0  | 0  | 1  | 0  | 1  | 0  | 1  |
| 14 | 0 | 0 | 0 | 0 | 0 | 0 | 0 | 0 | 0 | 0  | 0  | 1  | 1  | 0  | 1  | 1  |
| 15 | 0 | 0 | 0 | 0 | 0 | 0 | 0 | 1 | 0 | 0  | 0  | 1  | 0  | 1  | 0  | 1  |
| 16 | 0 | 0 | 0 | 0 | 0 | 0 | 0 | 1 | 0 | 0  | 0  | 0  | 1  | 1  | 1  | 0  |

| IDENTIFIERS OF FACES OF ANALYSIS MODEL GENERATION TARGET | IDENTIFIERS OF FACES OF SHAPE DECOMPOSITION PART |
|---|---|
| 3 | 1 |
| 4 | 2 |
| 9 | 3 |
| 10 | 4 |
| 11 | 5 |

HEXAHEDRAL MESH GENERATOR

BACKGROUND OF THE INVENTION

1. Field of the Invention

The present invention relates to a hexahedral mesh generator for generating an analysis model, and in particular, to a hexahedral mesh generator which generates a new analysis model by using existing analysis models.

2. Description of the Related Art

Making an analysis model of the target of analysis (analysis model generation target) in scientific calculation, CAE (Computer-Aided Engineering), etc. requires much know-how in regard to the type (shape), size, density, etc. of the mesh (e.g., hexahedral mesh or tetrahedral mesh). The quality of the analysis model varies greatly dependent on how skillfully such know-how is used. Thus, for those not skilled enough in the know-how for making analysis models, it is not easy to efficiently construct high-quality analysis models. In consideration of such a situation, there have been proposed techniques for supporting the construction of analysis models by using existing analysis models, as disclosed in JP-2003-108609-A, JP-2003-132099-A, and JP-2007-122205-A.

JP-2003-108609-A has disclosed a morphing method for morphing the shape of a structure. In the morphing method, the construction of an analysis model of a new model car is supported by making it possible to employ FEM models of existing cars for the construction of the analysis model of the new model car.

JP-2003-132099-A has disclosed an analysis model generating method. The analysis model generating method supports the construction of a new analysis model by using existing analysis models as templates so that the new analysis model can be constructed efficiently.

JP-2007-122205-A has disclosed an analysis model construction supporting system. The analysis model construction supporting system compares the analysis model generation target with existing analysis models and thereby decomposes the analysis model generation target into parts similar to the existing analysis models (similar parts) and a dissimilar part. Then, the system constructs a new analysis model by use of the existing analysis models, by generating new mesh for the dissimilar part while employing the meshes of the existing analysis models for the similar parts.

SUMMARY OF THE INVENTION

Using existing analysis models for the construction of a new analysis model as described in the JP-2003-108609-A and JP-2003-132099-A is an effective method for supporting the construction of analysis models. However, the shapes of the existing analysis models generally differ partially from the shape of the new analysis model generation target. The conventional techniques are still insufficient for handling the parts differing in the shape. Specifically, the mesh of a new analysis model has to be newly generated for the parts differing in the shape in the conventional techniques and the region in which the mesh data of existing analysis models is usable is small.

Meanwhile, in the technique decomposing the analysis model generation target into the similar parts (similar to existing analysis models) and the dissimilar part and generating new mesh for the dissimilar part while employing the meshes of the existing analysis models for the similar parts (e.g., JP-2007-122205-A), the mesh generation in the dissimilar part cannot necessarily be performed efficiently for the following reason: In the case where the hexahedral mesh is newly generated, the analysis model generation target has to be decomposed into shapes allowing for the generation of the hexahedral mesh. However, this decomposition requires a lot of know-how and the number of steps or man-hours necessary for generating the analysis model is determined by how skillfully such know-how is used.

The object of the present invention, which has been made in consideration of the above situation, is to provide a hexahedral mesh generator capable of saving the labor of the work of decomposing the analysis model generation target into shapes allowing for the generation of hexahedral mesh and thereby realizing efficient construction of analysis models.

The hexahedral mesh generator in accordance with the present invention has the following features:

In accordance with an aspect of the present invention, there is provided a hexahedral mesh generator which is connected to an output device, receives data of an analysis model generation target inputted thereto, and makes an analysis model by generating hexahedral mesh for the analysis model generation target, comprising: an existing analysis model database which stores data of shapes of existing analysis models before undergoing shape decomposition for the generation of hexahedral mesh and data of shapes of the existing analysis models after undergoing the shape decomposition; a shape decomposition part extracting module which compares the shape of each existing analysis model before the shape decomposition with the shape of the existing analysis model after the shape decomposition and thereby extracts a shape decomposition part as a part of the existing analysis model where the shape decomposition was executed; a shape comparison module which compares each shape decomposition part with the analysis model generation target and thereby checks whether or not the shape decomposition part coincides with at least part of the analysis model generation target; a coinciding shape decomposition part display/selection module which displays a list of the shape decomposition parts found by the shape comparison module to coincide with at least part of the analysis model generation target on the output device, receives selection of one or more shape decomposition parts from the list by the user of the hexahedral mesh generator, and outputs data of the selected shape decomposition parts; a shape decomposition module which decomposes the shape of the analysis model generation target in the same way as the shape decomposition parts outputted by the coinciding shape decomposition part display/selection module; and a hexahedral mesh generating module which generates the hexahedral mesh for the analysis model generation target after undergoing the shape decomposition by the shape decomposition module.

The hexahedral mesh generator in accordance with the present invention is capable of saving the labor of the work of decomposing the analysis model generation target into shapes allowing for the generation of hexahedral mesh and thereby realizing efficient construction of analysis models.

BRIEF DESCRIPTION OF THE DRAWINGS

Other objects and advantages of the invention will become apparent from the following description of embodiments with reference to the accompanying drawings in which:

FIG. 8 is a schematic diagram imaging the process for extracting the shape decomposition part;

FIG. 10 is a schematic diagram showing the adjacency matrix of the shape decomposition part;

FIG. 11 is a schematic diagram showing the adjacency matrix of the analysis model generation target;

FIG. 12 is a schematic diagram showing the adjacency matrix of the analysis model generation target after transformation;

FIG. 13 is a table showing an example of face correspondence data;

DESCRIPTION OF THE PREFERRED EMBODIMENTS

The hexahedral mesh generator in accordance with the present invention decomposes the shape of an analysis model generation target (the target of generating an analysis model) into multiple shapes, generates hexahedral mesh for each of the decomposed shapes, and thereby generates the analysis model of the analysis model generation target. The labor of the work of decomposing the shape of the analysis model generation target can be saved considerably by using the shapes of existing analysis models before and after the decomposition. If the shape of an existing analysis model before the decomposition coincides with at least part of the analysis model generation target, the shape of the analysis model generation target is decomposed by using the coinciding part. Therefore, it is not necessary that an existing analysis model and the analysis model generation target coincide with or resemble each other as a whole. If at least part of an existing analysis model coincides with the analysis model generation target, the shape of the existing analysis model after the decomposition can be used. As above, the hexahedral mesh generator in accordance with the present invention is capable of generating the analysis model with high efficiency.

In the following description, data for representing the shape of the analysis model generation target or the shape of an analysis model will be referred to as "shape data". The shape data includes data of points, lines, faces, etc. constituting the shape. Among the shape data of the analysis model generation target and the shape data of analysis models, shape data before the execution of the decomposition for generating the hexahedral mesh will be referred to as "pre-decomposition shape data", and shape data after the execution of the decomposition will be referred to as "post-decomposition shape data". Thus, the pre-decomposition shape data means shape data of an analysis model (or the analysis model generation target) before the shape decomposition for the generation of the hexahedral mesh, and the post-decomposition shape data means shape data of an analysis model (or the analysis model generation target) after the shape decomposition for the generation of the hexahedral mesh.

In the following, a hexahedral mesh generator in accordance with the present invention will be described by properly referring to figures.

Figure 1:
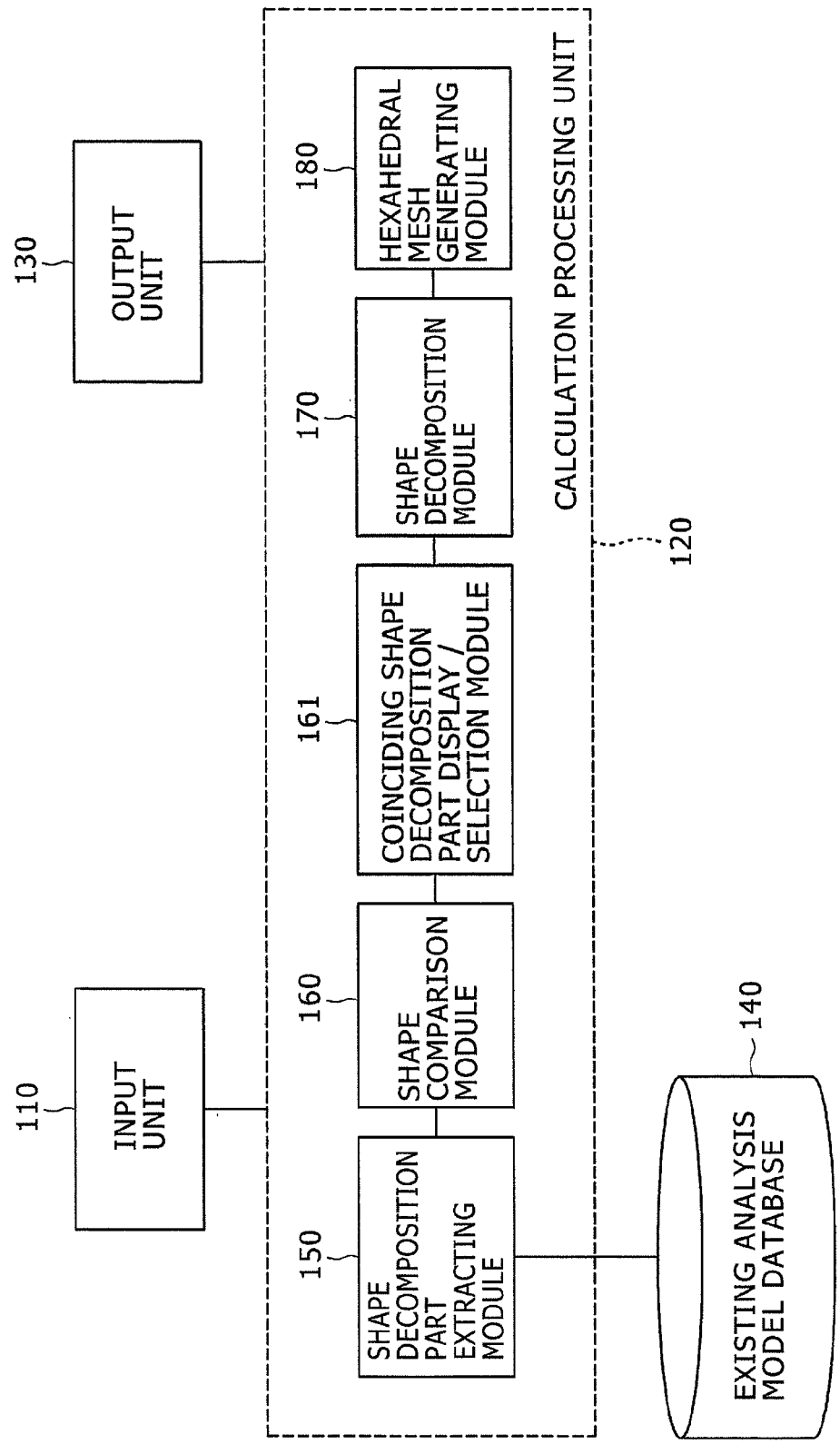
FIG. 1 is a block diagram showing the configuration of a hexahedral mesh generator in accordance with an embodiment of the present invention.

FIG. 1 is a block diagram showing the configuration of a hexahedral mesh generator in accordance with an embodiment of the present invention. As shown in FIG. 1, the hexahedral mesh generator in accordance with this embodiment comprises an input unit 110, a calculation processing unit 120, an existing analysis model database 140, and an output unit 130. The input unit 110, calculation processing unit 120, existing analysis model database 140 and output unit 130 may either be connected directly or via a network such as the Internet or an intranet.

The input unit 110 receives a variety of information inputted thereto, such as data regarding an analysis model generation target (the target of generating the analysis model) and instructions from the user of the hexahedral mesh generator. The data regarding the analysis model generation target include analysis model generation target data as shape data of the analysis model generation target. In this description, the analysis model generation target data (data of the analysis model generation target) can also be referred to simply as "the analysis model generation target". The input unit 110 is connected to devices such as a hard disk drive, a CD-ROM drive, a DVD drive, a memory card reader, a keyboard and a mouse and loads data inputted from these devices.

The existing analysis model database 140 stores and accumulates existing analysis models while associating their pre-decomposition shape data and post-decomposition shape data with each other. The existing analysis model database 140 can be implemented by a storage device such as a hard disk drive.

The output unit 130 is connected to an output device such as a display device. The output unit 130 displays the progress and the result of processes executed by the calculation processing unit 120, screens (user interfaces) for letting the user perform interactive processes, etc. on the output device. By viewing the screens displayed by the output unit 130, the user of the hexahedral mesh generator can conduct (command) various processes (the loading of the analysis model generation target, the shape decomposition, the storing of the analysis model generation target, etc.) in the interactive manner.

The calculation processing unit 120 executes information processing necessary in the hexahedral mesh generator. Specifically, the calculation processing unit 120 can be implemented by a CPU (Central Processing Unit). The calculation processing unit 120 includes a shape decomposition part extracting module 150, a shape comparison module 160, a coinciding shape decomposition part display/selection module 161, a shape decomposition module 170 and a hexahedral mesh generating module 180.

Figure 2:
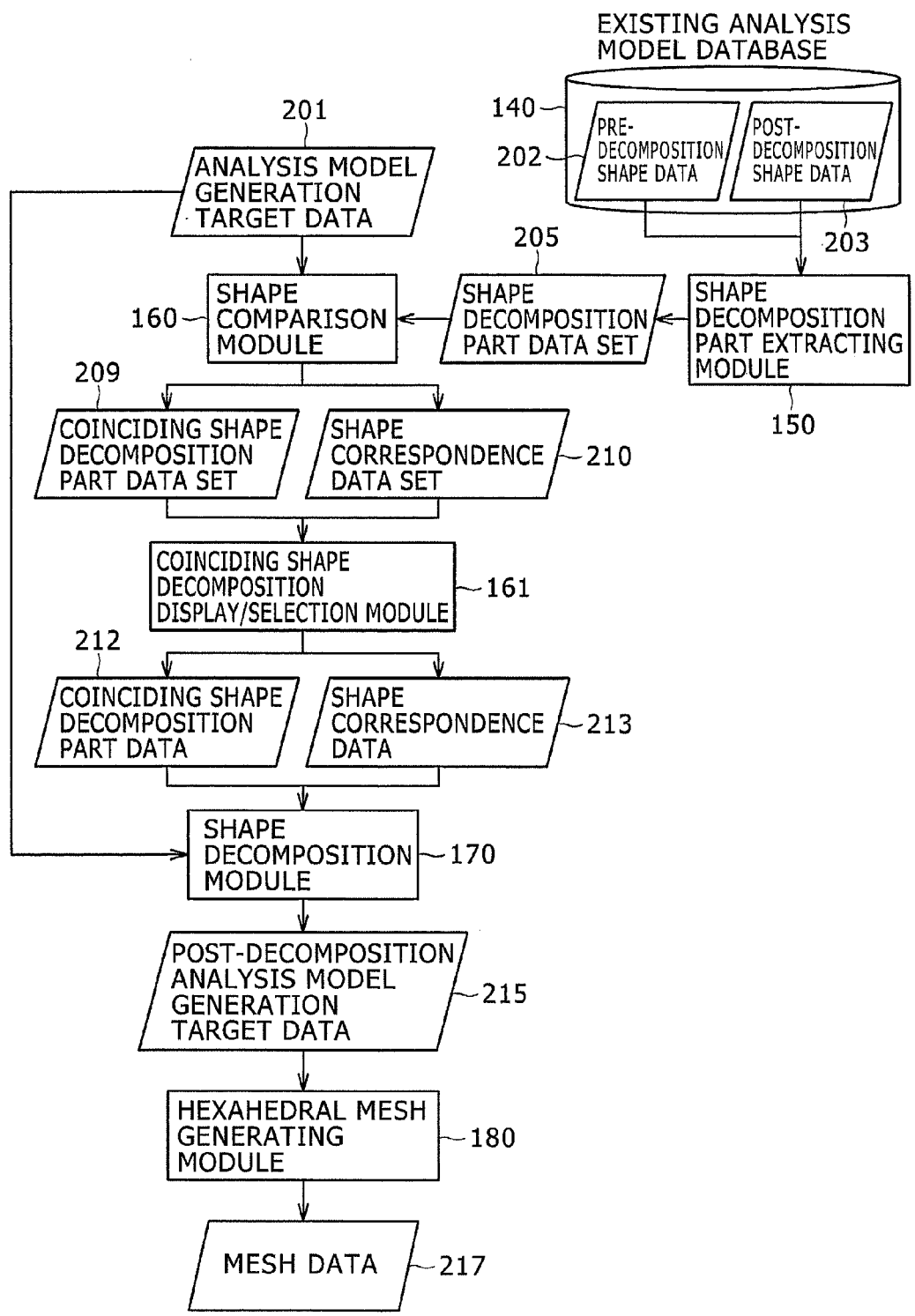
FIG. 2 is a schematic diagram showing principal data flow in the hexahedral mesh generator.

In the following, the information processing executed by the calculation processing unit 120 will be explained referring to FIG. 2. FIG. 2 is a schematic diagram showing principal data flow in the hexahedral mesh generator.

As mentioned above, pre-decomposition shape data 202 and post-decomposition shape data 203 of existing analysis models have been stored in the existing analysis model database 140 while being associated with each other.

For every existing analysis model stored in the existing analysis model database 140, the shape decomposition part extracting module 150 compares the pre-decomposition shape data 202 with the post-decomposition shape data 203, extracts only a part where the shape of the existing analysis model was decomposed (shape decomposition part) from each existing analysis model as shape decomposition part data, aggregates the extracted shape decomposition part data, and outputs the aggregated data as a shape decomposition part data set 205. The shape decomposition part data set 205 is a set of the shape decomposition part data extracted from the existing analysis models stored in the existing analysis model database 140. The shape decomposition part data is data regarding the shape decomposition part (part where the shape decomposition was executed). The shape decomposition part data includes information on points, lines and faces that were added during the shape decomposition. The shape decomposition part data also includes at least topological information, geometrical information, etc. regarding the shape decomposition part, such as information on connective relationship among faces in the shape decomposition part (part where the shape decomposition was executed), information on lines forming each face and the type of each face, information on points forming each line and the type of each line, and the coordinate values of each point.

The shape comparison module 160 receives the shape decomposition part data set 205 and the analysis model generation target data 201 inputted by the input unit 110, compares the analysis model generation target data 201 with the shape decomposition part data extracted by the shape decomposition part extracting module 150, and thereby checks whether the analysis model generation target has a part coinciding with a shape decomposition part. When there is a coinciding part, the shape comparison module 160 makes association of points, lines, faces, etc. between the analysis model generation target and the shape decomposition part and thereby generates shape correspondence data which indicates shape correspondence between the analysis model generation target and the shape decomposition part. The shape correspondence data at least includes point correspondence data, line correspondence data and face correspondence data. The point correspondence data, the line correspondence data and the face correspondence data are data describing to which point/line/face of the shape decomposition part each point/line/face of the analysis model generation target corresponds.

The shape comparison module 160 executes the above process for every shape decomposition part, in which the shape correspondence data is generated when at least part of the analysis model generation target coincides with the shape decomposition part. Then, the shape comparison module 160 outputs the generated shape correspondence data (generated set of shape correspondence data) and a set of data of the shape decomposition parts corresponding to the generated shape correspondence data as a shape correspondence data set 210 and a coinciding shape decomposition part data set 209, respectively.

The coinciding shape decomposition part display/selection module 161 receives the shape correspondence data set 210 and the coinciding shape decomposition part data set 209 and displays a list of the coinciding shape decomposition parts (each coinciding with at least part of the analysis model generation target) on the display device via the output unit 130. The user of the hexahedral mesh generator can select a desired shape decomposition part from the shape decomposition part list displayed by the output unit 130 on the display device. When the selection of a shape decomposition part by the user is inputted via the input unit 110, the coinciding shape decomposition part display/selection module 161 outputs the shape decomposition part data of the shape decomposition part selected by the user (coinciding shape decomposition part data 212) and the shape correspondence data 213 of the shape decomposition part.

The shape decomposition module 170 receives the coinciding shape decomposition part data 212, the shape correspondence data 213 and the analysis model generation target data 201. After these pieces of data have been inputted, the shape decomposition module 170 makes association between the analysis model generation target and the shape decomposition part based on the shape correspondence data 213 and performs the shape decomposition on the analysis model generation target in the same way as the shape decomposition part. Then, the shape decomposition module 170 outputs the shape data of the analysis model generation target after undergoing the shape decomposition as post-decomposition analysis model generation target data 215.

The hexahedral mesh generating module 180 receives the post-decomposition analysis model generation target data 215 and generates the hexahedral mesh for the analysis model generation target after undergoing the shape decomposition by the shape decomposition module 170. Finally, the hexahedral mesh generating module 180 outputs the generated hexahedral mesh as mesh data 217.

Figure 3:
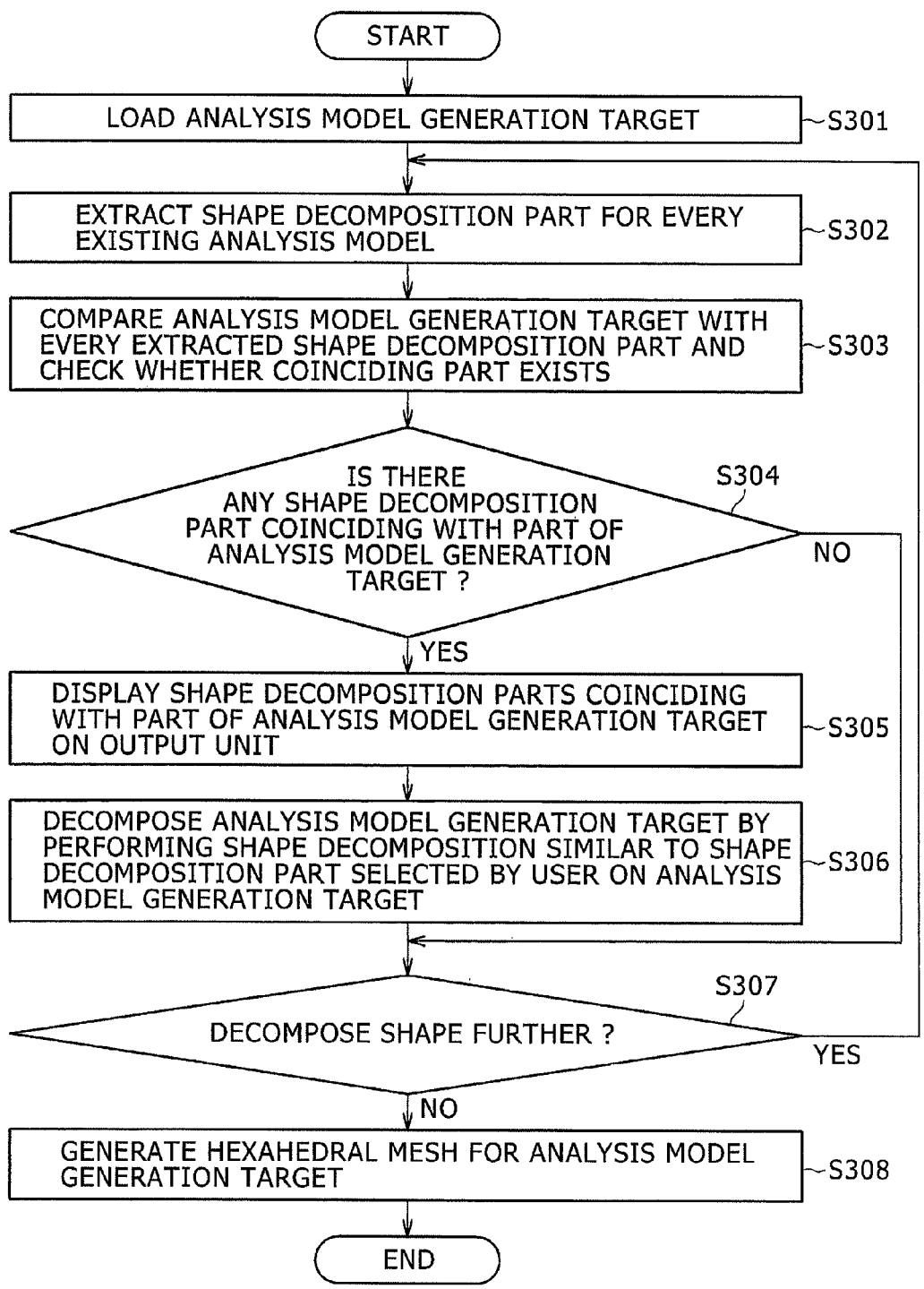
FIG. 3 is a flow chart showing the flow of the process executed by the hexahedral mesh generator.

Next, the flow of the process executed by the hexahedral mesh generator in accordance with this embodiment will be explained referring to FIG. 3 and FIG. 1. FIG. 3 is a flow chart showing the flow of the process executed by the hexahedral mesh generator.

First, the input unit 110 of the hexahedral mesh generator loads an analysis model generation target specified by the user (S301).

Subsequently, for every existing analysis model stored in the existing analysis model database 140, the shape decomposition part extracting module 150 extracts the shape decomposition part (part where the shape decomposition was executed) (S302). Points, lines and faces are added to the shape decomposition part during the execution of the shape decomposition. Therefore, the shape decomposition part extracting module 150 extracts the part to which points, lines and faces have been added (the part with the added points, lines and faces) as the shape decomposition part.

Figure 4:
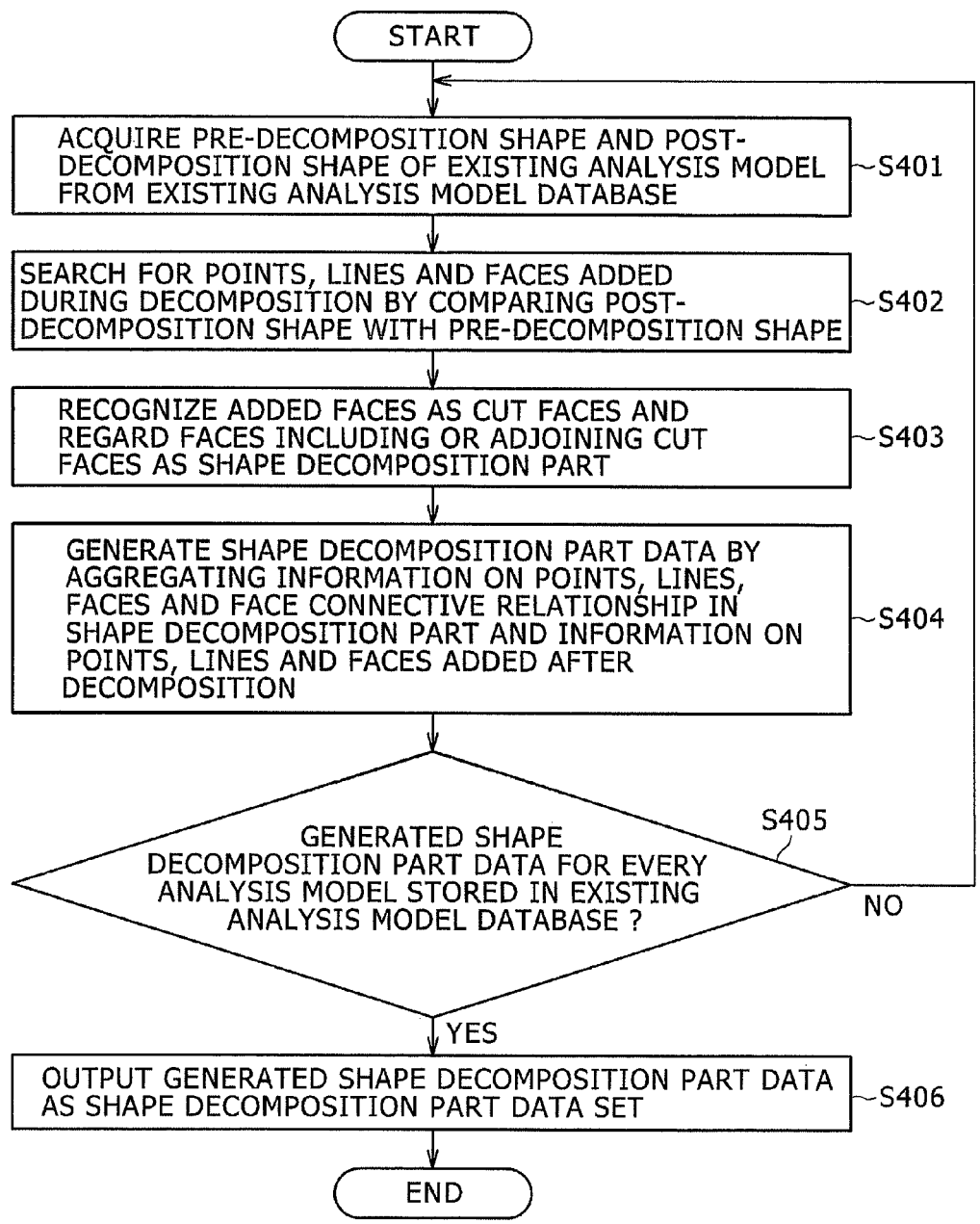
FIG. 4 is a flow chart showing the flow of a process for extracting a shape decomposition part from an existing analysis model.

Here, the details of the process of the step S302 will be described referring to FIG. 4. FIG. 4 is a flow chart showing the flow of the process (step S302) executed by the shape decomposition part extracting module 150 for extracting the shape decomposition part from the existing analysis model.

First, the shape decomposition part extracting module 150 acquires the pre-decomposition shape data 202 and the post-decomposition shape data 203 of the existing analysis model from the existing analysis model database 140 (S401). As mentioned above, the pre-decomposition shape data 202 and the post-decomposition shape data 203 of the existing analysis model have been stored in the existing analysis model database 140 while being associated with each other.

Subsequently, the shape decomposition part extracting module 150 compares the post-decomposition shape data 203 with the pre-decomposition shape data 202 and thereby searches for the points, lines and faces that were added during the shape decomposition (S402). Specifically, the shape decomposition part extracting module 150 makes association between the pre-decomposition shape (solid model) and the post-decomposition shape (decomposed volumes) by using the identifiers (e.g., numbers), coordinate values, etc. of the points, lines and faces and regards points, lines and faces existing in the post-decomposition shape (decomposed volumes) and not existing in the pre-decomposition shape (solid model) as the points, lines and faces added during the shape decomposition.

The shape decomposition part extracting module 150 recognizes the faces found in the step S402 (faces regarded as those added during the shape decomposition) as cut surfaces, and regards a group of faces including or adjoining the cut surfaces as the shape decomposition part (S403).

The shape decomposition part extracting module 150 generates shape decomposition part data by aggregating data necessary for reproducing the pre-decomposition shape and the post-decomposition shape of the shape decomposition part, such as information on the connective relationship among the faces of the shape decomposition part, information on the points, lines and faces of the shape decomposition part, and information on the points, lines and faces added during the decomposition (S404).

The shape decomposition part extracting module 150 executes the steps S401-S404 and generates the shape decomposition part data for every analysis model stored in the existing analysis model database 140 (S405).

Finally, the shape decomposition part extracting module 150 aggregates the generated shape decomposition part data and outputs the aggregated data as the shape decomposition part data set 205 (S406).

Returning to FIG. 3, the remaining part of the process executed by the hexahedral mesh generator will be explained below.

The shape comparison module 160 compares the analysis model generation target with the shape decomposition part and thereby checks whether the analysis model generation target has a part coinciding with the shape decomposition part (S303). The shape comparison module 160 executes this process for every shape decomposition part extracted in the step S302.

Figure 5:
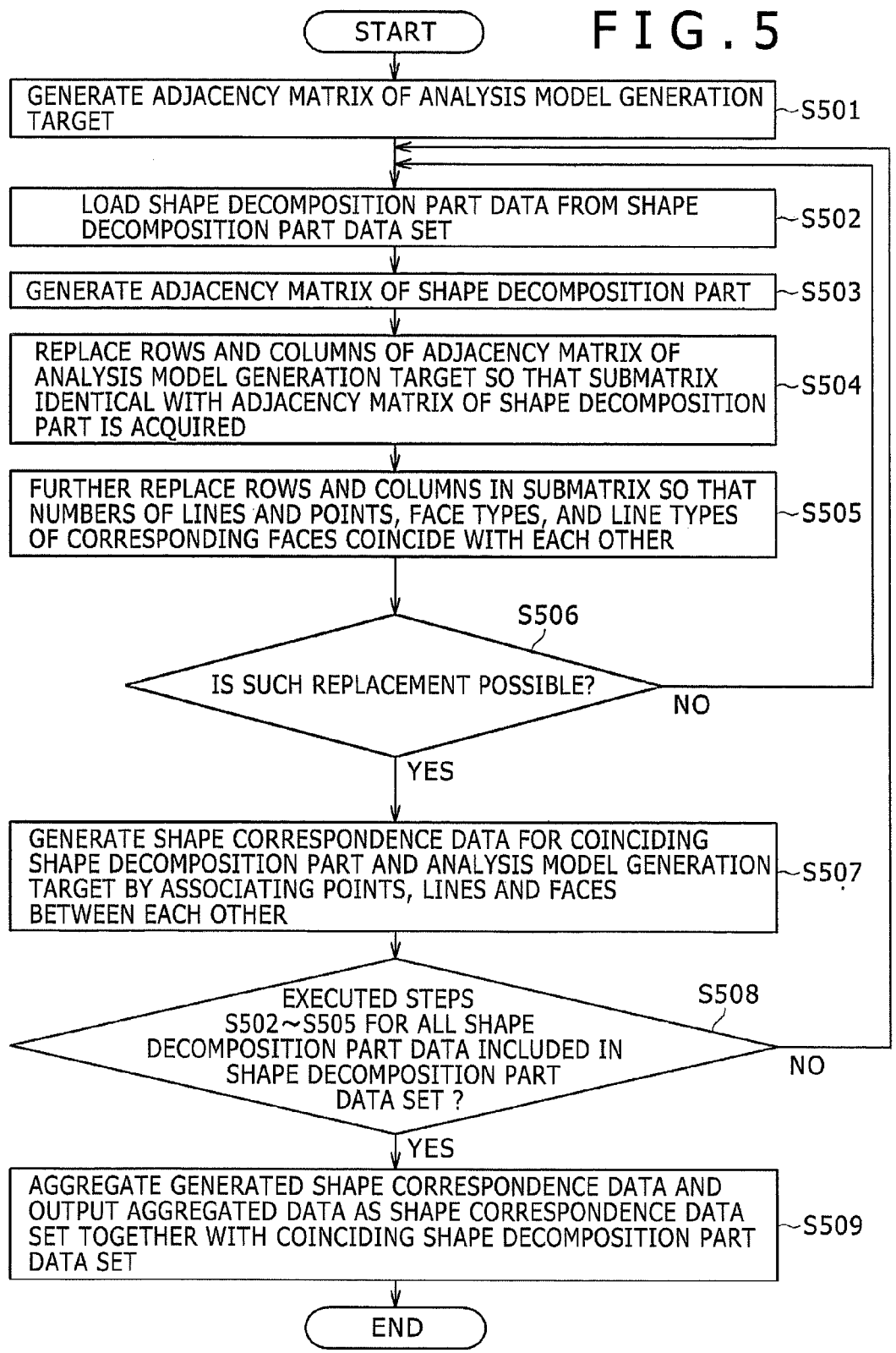
FIG. 5 is a flow chart showing the flow of a process for checking whether an analysis model generation target has a part coinciding with the shape decomposition part.

Here, the details of the process of the step S303 will be described referring to FIG. 5. FIG. 5 is a flow chart showing the flow of the process (step S303) executed by the shape comparison module 160 for checking whether the analysis model generation target has a part coinciding with the shape decomposition part.

First, the shape comparison module 160 generates an adjacency matrix of the analysis model generation target in order to compare the analysis model generation target with the shape decomposition part (S501). The adjacency matrix is a matrix used for representing a graph. In this embodiment, the adjacency matrix is used for representing the connective relationship among faces. Each row/column of the adjacency matrix corresponds to each face belonging to the shape. For example, when the adjacency matrix is a matrix having n rows and n columns (n: the number of faces belonging to the shape) and the i-th face and the j-th face belonging to the shape adjoin each other (1≤i≤n, 1≤j≤n), the element in the i-th column and in the j-th row (hereinafter referred to as a "(j, i) element") is represented as "1". In contrast, when the i-th face and the j-th face belonging to the shape do not adjoin each other, the (j, i) element is represented as "0". Further, (i, i) elements (diagonal elements of the adjacency matrix) are represented as "0". When the adjacency matrices of two shapes are identical with each other, the two shapes can be considered to have the same face connective relationship (connective relationship among faces).

Further, according to the aforementioned definition of the adjacency matrix, if the i-th column (column i) and the j-th column (column j) of the adjacency matrix are replaced (exchanged) and further the i-th row (row i) and the j-th row (row j) are replaced, the resultant matrix has the same face connective relationship as the original adjacency matrix. In the following description, replacing columns i and j and rows i and j of the adjacency matrix at the same time will be referred to simply as "replacing rows and columns" for the simplicity of the explanation.

The adjacency matrix can be generated with ease from the shape data of the analysis model generation target and the shape decomposition part. For example, when lines forming the i-th face and the j-th face belonging to the shape are examined, the i-th face and the j-th face can be considered to adjoin each other if the two faces contain the same line. In this case, the (j, i) element and the (i, j) element of the adjacency matrix are set at "1". In contrast, when the i-th face and the j-th face do not contain the same line, the (j, i) element and the (i, j) element of the adjacency matrix are set at "0".

Then, the shape comparison module 160 loads the shape decomposition part data of a shape decomposition part from the shape decomposition part data set 205 generated in the step S302 (S502).

From the loaded shape decomposition part data, the shape comparison module 160 generates an adjacency matrix for the shape decomposition part (S503).

Subsequently, the shape comparison module 160 compares the shapes of the analysis model generation target and the shape decomposition part by using the adjacency matrices and thereby checks whether the analysis model generation target has a part coinciding with the shape decomposition part. This shape comparison is made in steps S504 and S505 which will be explained below.

The shape comparison module 160 replaces rows and columns of the adjacency matrix of the analysis model generation target and compares the transformed adjacency matrix with the adjacency matrix of the shape decomposition part. Specifically, the shape comparison module 160 replaces rows and columns of the adjacency matrix of the analysis model generation target so that a part (submatrix) identical with the adjacency matrix of the shape decomposition part appears in the transformed adjacency matrix (S504). In other words, the shape comparison module 160 transforms the adjacency matrix of the analysis model generation target to let it have a part (submatrix) composed of the same elements as the adjacency matrix of the shape decomposition part by replacing rows and columns of the adjacency matrix of the analysis model generation target.

Then, the shape comparison module 160 further replaces rows and columns in the submatrix (part composed of the same elements as the adjacency matrix of the shape decomposition part) in the transformed adjacency matrix acquired by replacing rows and columns of the adjacency matrix of the analysis model generation target (S505). The replacement of rows and columns in the submatrix is executed so that the numbers of lines and points, face types, line types, etc. of faces corresponding to each other (between the submatrix and the adjacency matrix of the shape decomposition part) coincide with each other. When the numbers of lines and points, face types, line types, etc. do not coincide with each other, the process returns to the step S502.

In the case where the numbers of lines and points, face types, line types, etc. coincide with each other in the step S505 (S506: YES), a part of the analysis model generation target coincides with the shape decomposition part. This means that a part of the analysis model generation target coinciding with the shape decomposition part has been found successfully. In this case, the shape comparison module 160 generates the shape correspondence data for the coinciding shape decomposition part and the analysis model generation target by associating the points, lines and faces between each other (S507).

The shape comparison module 160 executes the above shape comparison between the analysis model generation target and the shape decomposition part and the above generation of the shape correspondence data for every piece of shape decomposition part data included in the shape decomposition part data set 205 (S508).

Finally, the shape comparison module 160 aggregates the generated shape correspondence data and outputs the aggregated data as the shape correspondence data set 210 (S509). At the same time, the shape comparison module 160 outputs a set of shape decomposition part data corresponding to the generated shape correspondence data (i.e., data of the shape decomposition parts coinciding with part of the analysis model generation target) as the coinciding shape decomposition part data set 209 together with the shape correspondence data set 210 (S509).

Returning to FIG. 3, the remaining part of the process executed by the hexahedral mesh generator will be explained below.

When at least one shape decomposition part coinciding with part of the analysis model generation target is found as the result of the step S303 (S304), that is, when the shape correspondence data set 210 contains one or more pieces of shape correspondence data, the coinciding shape decomposition part display/selection module 161 displays all the shape decomposition parts coinciding with part of the analysis model generation target on the display device via the output unit 130 (S305).

From the shape decomposition parts displayed by the output unit 130, the user of the hexahedral mesh generator selects at least one shape decomposition part that has undergone shape decomposition similar to shape decomposition that the user considers to be suitable for the analysis model generation target. The coinciding shape decomposition part display/selection module 161 receiving the user's selection outputs the shape decomposition part data (coinciding shape decomposition part data 212) and the shape correspondence data 213 corresponding to the shape decomposition part selected by the user. The coinciding shape decomposition part data 212 includes data of the points, lines and faces added during the shape decomposition.

Subsequently, the shape decomposition module 170 receiving the coinciding shape decomposition part data 212, the shape correspondence data 213 and the analysis model generation target data 201 performs shape decomposition similar to the shape decomposition part selected by the user on the analysis model generation target. Specifically, the shape decomposition module 170 referring to the coinciding shape decomposition part data 212 and the shape correspondence data 213 adds the added points, lines and faces (added during the shape decomposition) to corresponding parts of the analysis model generation target in the order of points, lines and faces and then decomposes the shape of the analysis model generation target at the added faces (S306).

If it is necessary to further decompose the analysis model generation target, the processing from the step S302 to the step S306 is repeated (S307).

Finally, after all the shape decomposition has been carried out, the hexahedral mesh generating module 180 generates the hexahedral mesh for the decomposed analysis model generation target and outputs the mesh data (S308). The hexahedral mesh can be generated by any existing method.

Incidentally, while the method of making the comparison between the analysis model generation target and the shape decomposition part by use of adjacency matrices and making the association between them has been described in this embodiment, the use of adjacency matrices is not necessarily essential. Any method may be employed as long as the connective relationship between faces can be expressed and the processing from the step S302 to the step S306 can be carried out.

In the following, a concrete example of the above process of the hexahedral mesh generator in accordance with this embodiment will be described in detail.

Figure 6:
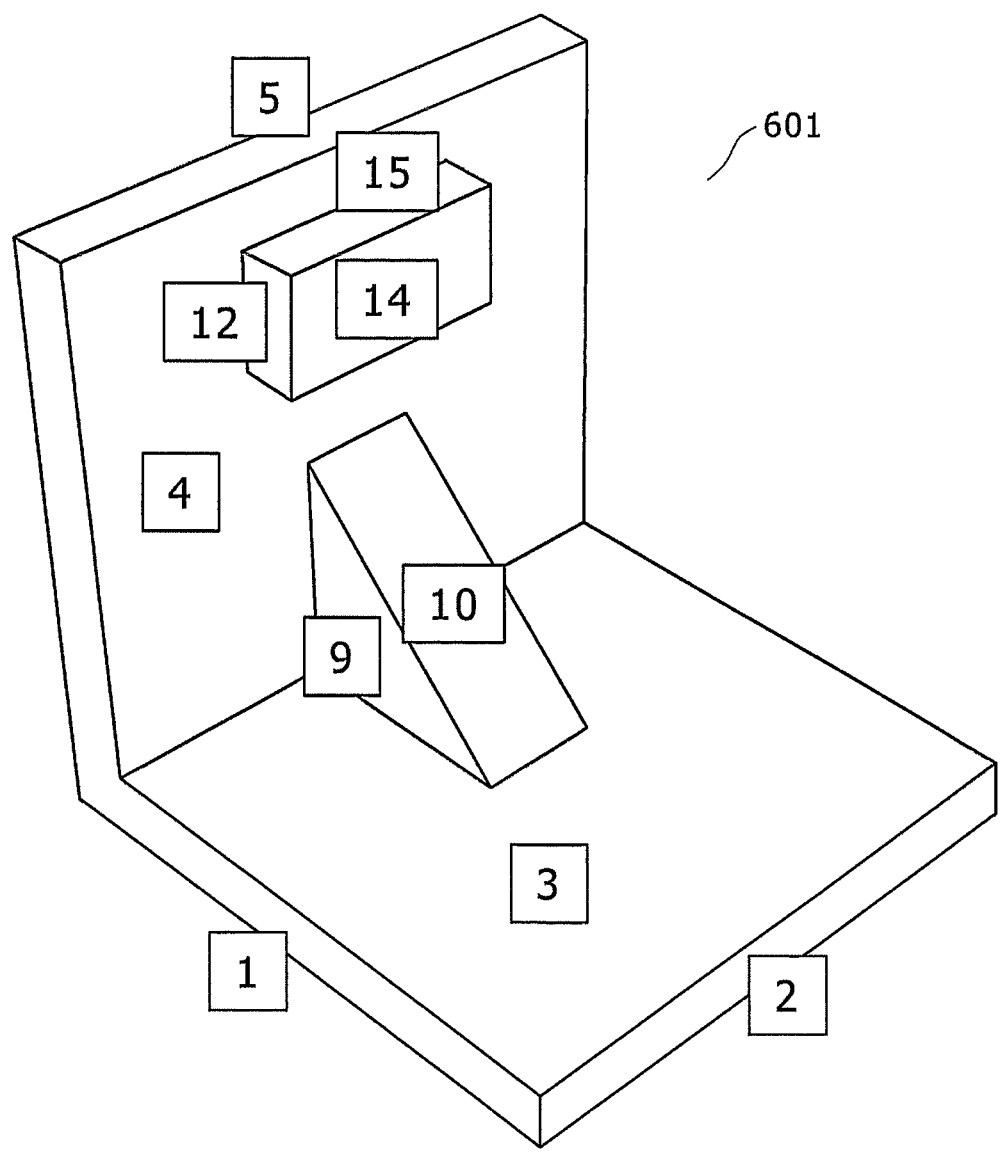
FIG. 6 is a schematic diagram showing an example of the analysis model generation target.

FIG. 6 is a schematic diagram showing an example of the analysis model generation target. As shown in FIG. 6, the analysis model generation target 601 has a shape made up of an L-shaped part, a rectangular prism part and a triangular prism part. An identifier (number from 1 to 16) has been assigned to each face. In the following example, the execution of the mesh generation to the analysis model generation target 601 through the shape decomposition will be considered. Although not shown in FIG. 6, the analysis model generation target 601 has faces that are assigned unshown identifiers "6", "7", "8", "11", "13" and "16", which are faces opposing the faces with the identifiers "4", "3", "1", "9", "15" and "12", respectively.

Figure 7:
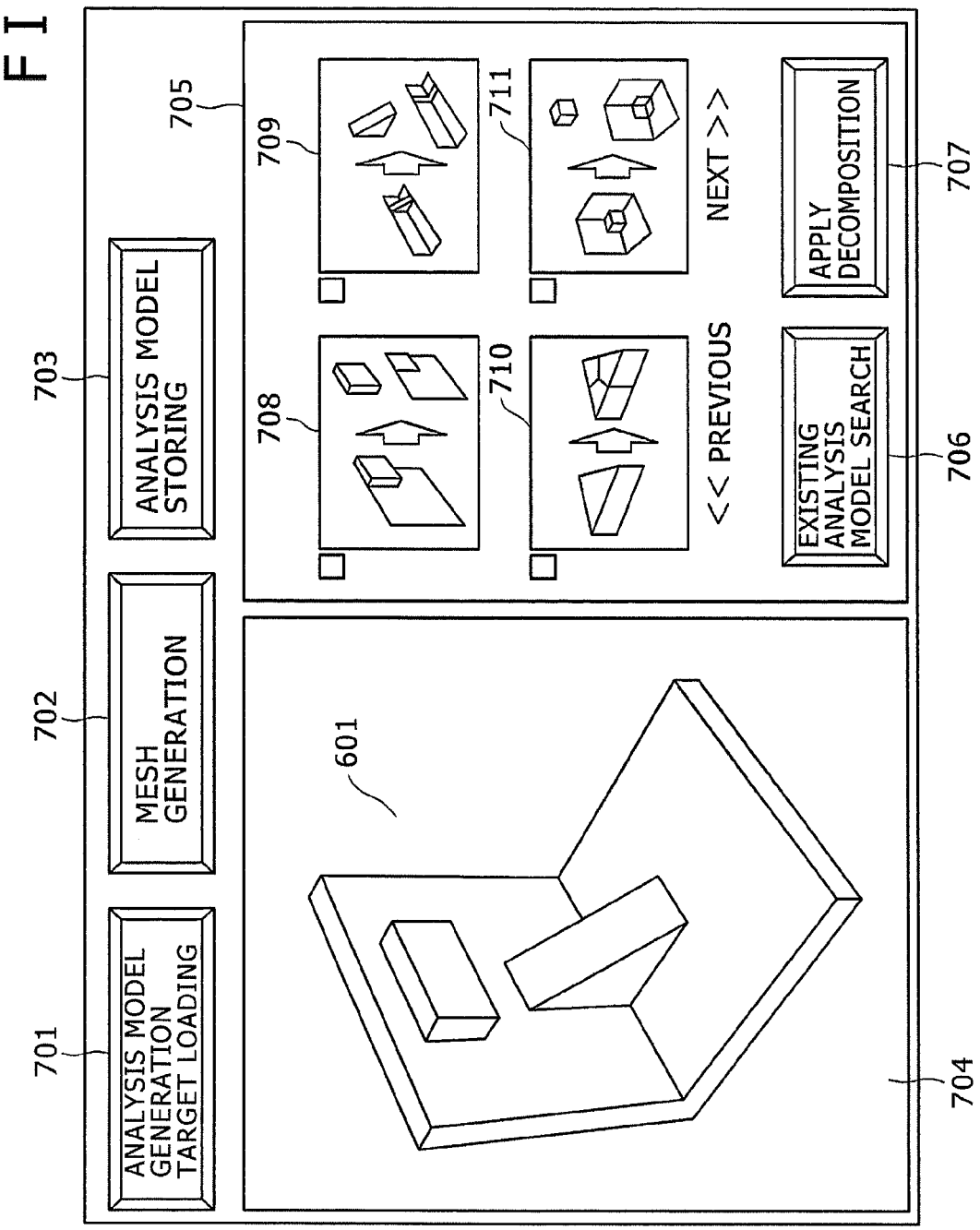
FIG. 7 is a schematic diagram showing an example of a user interface screen displayed on a display device by an output unit of the hexahedral mesh generator.

FIG. 7 is a schematic diagram showing an example of a screen displayed on the display device as the user interface by the output unit 130 of the hexahedral mesh generator. The user interface screen shown in FIG. 7 includes an analysis model generation target loading button 701, a mesh generation button 702, an analysis model storing button 703, an analysis model generation target display area 704, a coinciding shape decomposition part display area 705, an existing analysis model search button 706 and an "APPLY DECOMPOSITION" button 707.

First, when the analysis model generation target loading button 701 is pressed by the user, the hexahedral mesh generator displays a screen for letting the user select an analysis model generation target to be loaded. When the user has selected an analysis model generation target from the screen, the hexahedral mesh generator loads the selected analysis model generation target and displays its shape in the analysis model generation target display area 704. In the analysis model generation target display area 704 shown in FIG. 7, the analysis model generation target 601 shown in FIG. 6 has been displayed.

Subsequently, when the existing analysis model search button 706 is pressed by the user, the hexahedral mesh generator extracts the shape decomposition part (part where the shape decomposition was executed) from each existing analysis model stored in the existing analysis model database 140 (see FIG. 1) by use of the shape decomposition part extracting module 150.

FIG. 8 is a schematic diagram imaging the process for extracting the shape decomposition part. In FIG. 8, the upper part shows an example of the pre-decomposition shape and the post-decomposition shape of an existing analysis model. The lower part of FIG. 8 shows an example of the pre-decomposition shape and the post-decomposition shape exclusively for the extracted shape decomposition part.

In the upper part of FIG. 8 showing the pre-decomposition shape and the post-decomposition shape of the existing analysis model, the left part shows the pre-decomposition shape and the right part shows the post-decomposition shape. As shown in the left part, the pre-decomposition shape of the analysis model is made up of an L-shaped part 801 and a triangular prism part 802 which are connected to each other. In the post-decomposition shape shown in the right part, the shape of the analysis model has been decomposed into the L-shaped part 801 and the triangular prism part 802. In the post-decomposition shape, six points 803 and six lines 804 have been added to the L-shaped part 801 and two faces 805 have been added to the triangular prism part 802. Incidentally, the two faces 805 added to the triangular prism part 802 can not be seen in FIG. 8 since they are the base and the back of the triangular prism part 802.

The lower part of FIG. 8 exclusively shows the extracted shape decomposition part as part of the existing analysis model. In the lower part, the left part shows the pre-decomposition shape and the right part shows the post-decomposition shape. In the left part, the triangular prism part 802 and faces 806 of the L-shaped part 801 (to which the triangular prism part 802 is connected) are shown as the shape decomposition part before the decomposition. In the right part, the triangular prism part 802 and the faces 806 decomposed (detached) from each other are shown as the shape decomposition part after the decomposition, in which the points 803 and the lines 804 have been added to the faces 806, and the faces 805 (not seen) have been added to the triangular prism part 802. Thus, the part of the existing analysis model to which the points 803, the lines 804 and the faces 805 have been added as shown in the upper part of FIG. 8 is extracted as the shape decomposition part as illustrated in the lower part of FIG. 8.

After extracting the shape decomposition part from the existing analysis model, the hexahedral mesh generator checks whether the analysis model generation target has a part coinciding with the shape decomposition part or not by use of the shape comparison module 160 (see FIG. 1). Here, an example of the comparison between the analysis model generation target and the shape decomposition part by use of the aforementioned adjacency matrices will be described.

Figure 9:
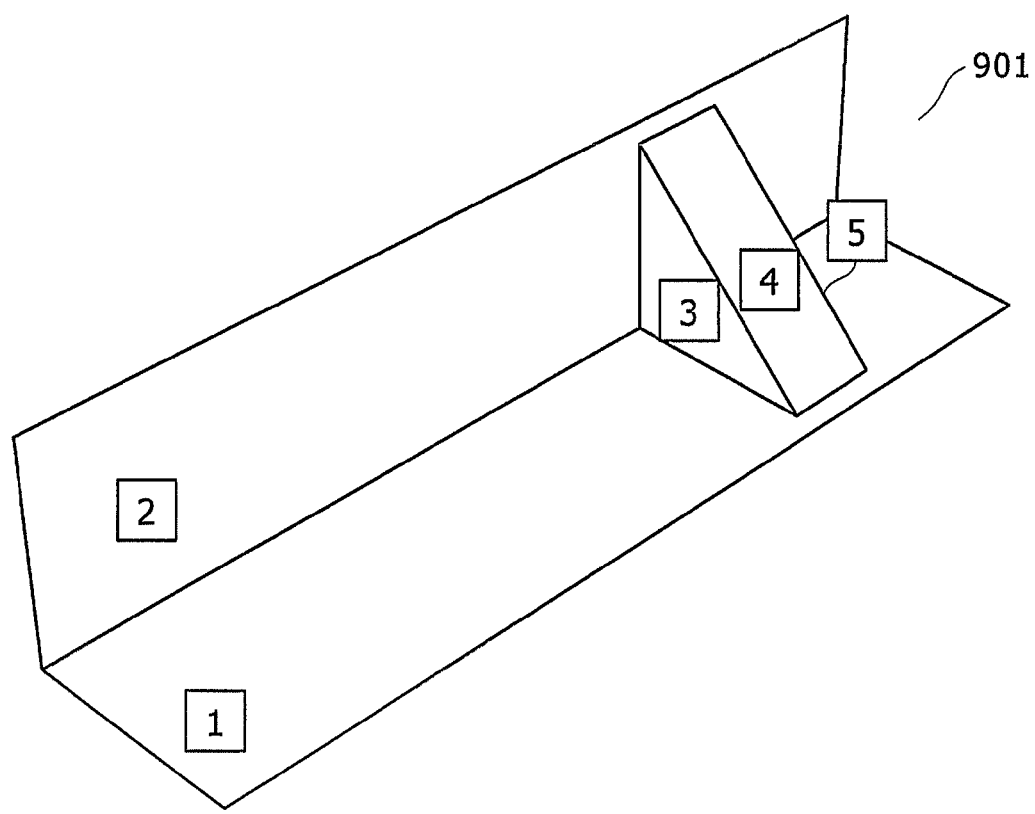
FIG. 9 is a schematic diagram showing an example of the shape decomposition part.

First, the shape comparison module 160 checks whether or not the adjacency matrix of the analysis model generation target has a part coinciding with the adjacency matrix of the shape decomposition part. Referring first to FIGS. 9-11, an example of the adjacency matrices of the shape decomposition part and the analysis model generation target will be explained below.

FIG. 9 shows the shape decomposition part which has been illustrated in the lower left part of FIG. 8. In FIG. 9, identifiers (numbers from 1 to 5) have been assigned to the faces of the shape decomposition part 901.

FIG. 10 is a schematic diagram showing the adjacency matrix of the shape decomposition part 901. For example, since the face having the identifier 1 adjoins the faces having the identifiers 2-5, the value "1" has been assigned to the (2, 1) element, the (3, 1) element, the (4, 1) element, the (5, 1) element, the (1, 2) element, the (1, 3) element, the (1, 4) element, and the (1, 5) element of the adjacency matrix. Further, since the face having the identifier 5 adjoins the faces having the identifiers 1, 2 and 4, the value "1" has been set to the (1, 1) element, the (2, 1) element, the (4, 1) element, the (1, 2) element, and the (1, 4) element of the adjacency matrix. Since the faces having the identifiers 3 and 5 do not adjoin each other, the value "0" has been set to the (5, 3) element and the (3, 5) element of the adjacency matrix. The diagonal elements of the adjacency matrix have been assigned the value "0".

FIG. 11 is a schematic diagram showing the adjacency matrix of the analysis model generation target 601. Also in this adjacency matrix of the analysis model generation target 601, each element has been assigned the value "0" or "1" based on the face adjacency relationship similarly to the adjacency matrix of the shape decomposition part 901 shown in FIG. 10.

The shape comparison module 160 transforms the adjacency matrix of the analysis model generation target 601 by replacing (exchanging) rows and columns of the adjacency matrix so that a part (submatrix) identical with the adjacency matrix of the shape decomposition part 901 (FIG. 10) is formed in the adjacency matrix of the analysis model generation target 601. Specifically, the shape comparison module 160 may successively replace (exchange) rows and columns of the adjacency matrix of the analysis model generation target 601 for every possible combination and successively check whether a part (submatrix) identical with the adjacency matrix of the shape decomposition part 901 is formed or not. Alternatively, the shape comparison module 160 may also search for suitable combinations of row/column replacements by means of an optimization technique such as the genetic algorithm approach.

In the example of FIG. 11, if the columns 3-8 of the adjacency matrix of the analysis model generation target 601 are replaced to move the columns 3, 4, 5, 6, 7 and 8 respectively to the columns 7, 8, 3, 4, 5 and 6 and further the rows 3-8 of the adjacency matrix are replaced to move the rows 3, 4, 5, 6, 7 and 8 respectively to the rows 7, 8, 3, 4, 5 and 6, a part identical with the adjacency matrix of the shape decomposition part 901 appears in the adjacency matrix of the analysis model generation target 601. By actually carrying out these steps, the adjacency matrix of the analysis model generation target 601 is transformed to the matrix shown in FIG. 12.

FIG. 12 is a schematic diagram showing the adjacency matrix of the analysis model generation target 601 after the transformation of replacing rows and columns. As shown in FIG. 12, a part 1201 coinciding with the adjacency matrix of the shape decomposition part 901 (FIG. 10) can be found in the adjacency matrix of the analysis model generation target 601 after the transformation. This indicates that a part of the analysis model generation target 601 and the shape decomposition part 901 have the same connective relationship among the corresponding faces. Specifically, the adjacency matrix shown in FIG. 12 indicates that the connective relationship among the faces belonging to the shape decomposition part 901 and having the identifiers 1, 2, 3, 4 and 5 is the same as the connective relationship among the faces belonging to the analysis model generation target 601 and having the identifiers 3, 4, 9, 10 and 11.

Further, the shape comparison module 160 generates the face correspondence data by associating faces of the shape decomposition part 901 with faces of the analysis model generation target 601 belonging to the coinciding part 1201. The association of faces is made between the shape decomposition part 901 and the coinciding part 1201 of the analysis model generation target 601 by successively checking whether a face of the shape decomposition part 901 and a face belonging to the coinciding part 1201 coincide with each other (in regard to points and lines belonging to the face and the types of the lines belonging to the face) and then associating (pairing) faces so that the number of coinciding faces (coinciding pairs) becomes large.

FIG. 13 is a table showing an example of the face correspondence data. The faces of the analysis model generation target 601 having the identifiers 3, 4, 9, 10 and 11 have been associated with the faces of the shape decomposition part 901 having the identifiers 1, 2, 3, 4 and 5, respectively.

After making the association between faces, the shape comparison module 160 generates the line correspondence data and the point correspondence data by making the association also for lines and points belonging to the associated faces. The line correspondence data and the point correspondence data associate lines/points between the shape decomposition part 901 and the analysis model generation target 601 similarly to the face correspondence data.

Then, the shape comparison module 160 generates the shape correspondence data by aggregating the face correspondence data, the line correspondence data and the point correspondence data. The shape correspondence data is data representing the shape correspondence between the shape decomposition part 901 and the analysis model generation target 601.

The above process is executed for every existing analysis model stored in the existing analysis model database 140. If there is a shape coinciding between the analysis model generation target and the shape decomposition part, the coinciding shape decomposition part display/selection module 161 displays the entire shape of the coinciding shape decomposition part in the coinciding shape decomposition part display area 705 shown in FIG. 7. In the example of FIG. 7, four coinciding shape decomposition parts 708-711 have been displayed in the coinciding shape decomposition part display area 705. For each of the shape decomposition parts 708-711, the pre-decomposition shape and the post-decomposition shape are displayed as shown in the lower part of FIG. 8. When the icon "<<PREVIOUS" or "NEXT>>" in the coinciding shape decomposition part display area 705 is pressed, other shape decomposition parts are displayed in the coinciding shape decomposition part display area 705.

When the shapes of the coinciding shape decomposition parts have been displayed in the coinciding shape decomposition part display area 705 by the coinciding shape decomposition part display/selection module 161, the user selects one or more desirable shape decomposition parts from the coinciding shape decomposition part display area 705. In this case, the user selects at least one shape decomposition part that has undergone decomposition that the user wants to apply to the analysis model generation target.

When the "APPLY DECOMPOSITION" button 707 is pressed by the user after selecting one or more shape decomposition parts, the coinciding shape decomposition part display/selection module 161 inputs the user's selection of the shape decomposition parts and the shape decomposition module 170 performs the shape decomposition on the analysis model generation target in the same way as the selected shape decomposition parts. For example, when the user selects the shape decomposition parts 708, 709 and 710 shown in FIG. 7 and then presses the "APPLY DECOMPOSITION" button 707, the shape of the analysis model generation target is decomposed in the same way as the shape decomposition parts 708, 709 and 710 and displayed in the analysis model generation target display area 704.

Figure 14:
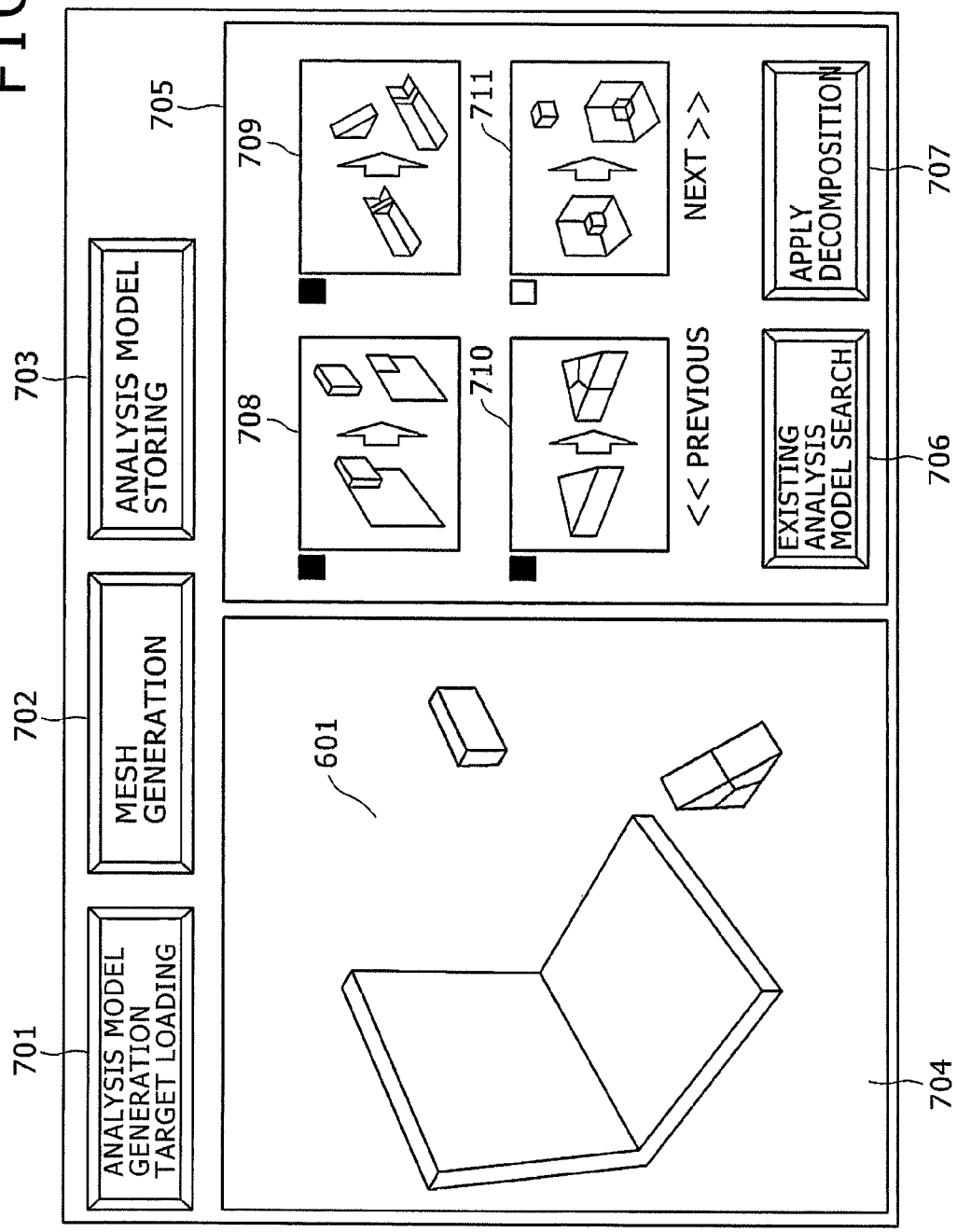
FIG. 14 is a schematic diagram showing an example of a user interface screen displaying the analysis model generation target after undergoing the shape decomposition.

FIG. 14 is a schematic diagram showing an example of the user interface screen displaying the analysis model generation target after undergoing the shape decomposition. The shape of the analysis model generation target 601 has been decomposed based on the shape decomposition parts 708, 709 and 710 and displayed in the analysis model generation target display area 704. Specifically, the analysis model generation target 601 has been decomposed into three parts (an L-shaped part, a rectangular prism part and a triangular prism part) based on the shape decomposition parts 708 and 709, and the triangular prism part has been further decomposed into three parts based on the shape decomposition part 710.

Subsequently, when the mesh generation button 702 is pressed by the user, the hexahedral mesh generating module 180 generates the hexahedral mesh for the analysis model generation target after undergoing the shape decomposition. The hexahedral mesh generating module 180 generates the hexahedral mesh for each of the decomposed shapes, combines the shapes after the hexahedral mesh generation, and displays the resultant hexahedral mesh of the analysis model generation target in the analysis model generation target display area 704.

Figure 15:
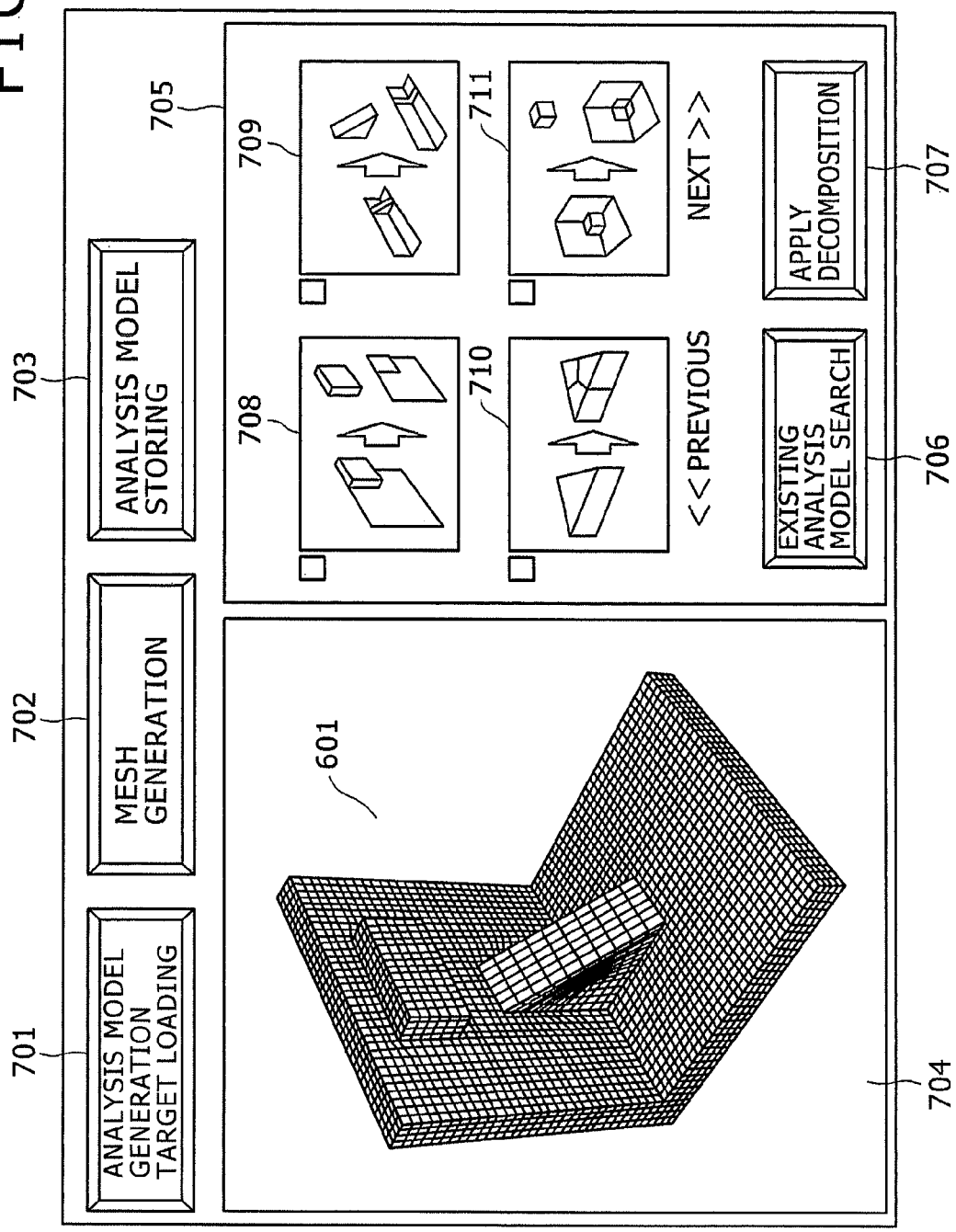
FIG. 15 is a schematic diagram showing an example of a user interface screen displaying the analysis model generation target after the generation of hexahedral mesh.

FIG. 15 is a schematic diagram showing an example of the user interface screen displaying the analysis model generation target after the hexahedral mesh generation. The analysis model generation target display area 704 is displaying the analysis model generation target 601 having the hexahedral mesh generated for it.

Finally, when the analysis model storing button 703 is pressed by the user, the hexahedral mesh generator stores the data of the analysis model generation target and the hexahedral mesh. The data of the analysis model generation target is stored in the existing analysis model database 140, while the data of the hexahedral mesh is stored in a storage device installed in or connected to the hexahedral mesh generator.

Figure 16:
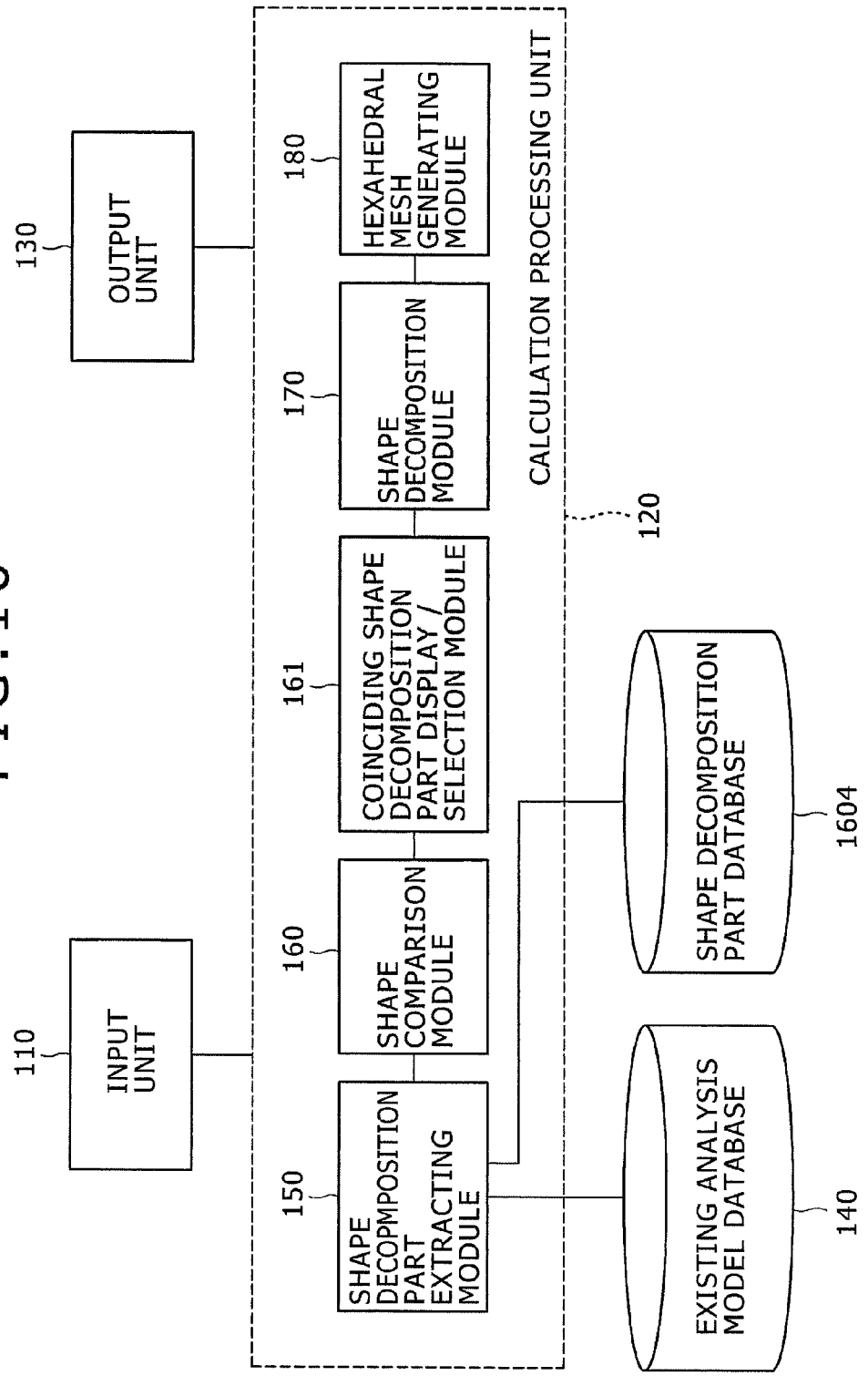
FIG. 16 is a block diagram showing another configuration of the hexahedral mesh generator in accordance with the embodiment.

FIG. 16 is a block diagram showing another configuration of the hexahedral mesh generator in accordance with this embodiment. Reference characters in FIG. 16 identical with those in FIG. 1 represent components equivalent to those in FIG. 1, and thus repeated explanation thereof is omitted for brevity.

In the configuration example shown in FIG. 16, the hexahedral mesh generator further comprises a shape decomposition part database 1604. The shape decomposition part extracting module 150 aggregates the extracted shape decomposition part data (data of the extracted shape decomposition parts) and stores the aggregated data in the shape decomposition part database 1604 as the shape decomposition part data set 205. The shape decomposition part data stored in the shape decomposition part database 1604 can be reused.

Figure 17:
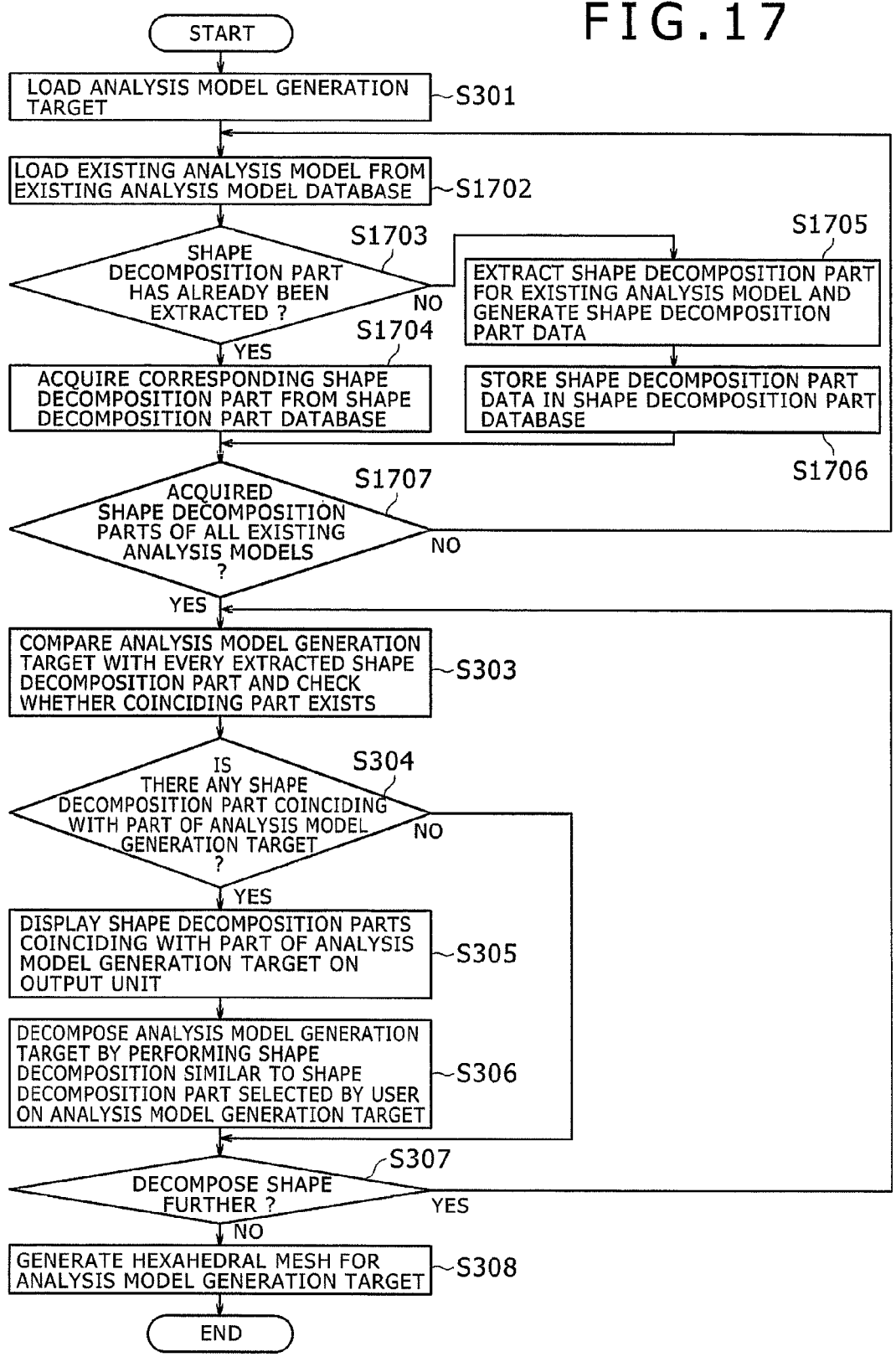
FIG. 17 is a flow chart showing the flow of a process executed by the hexahedral mesh generator configured as shown in FIG. 16.

FIG. 17 is a flow chart showing the flow of a process executed by the hexahedral mesh generator configured as shown in FIG. 16. Step numbers in FIG. 17 identical with those in FIG. 3 represent steps equivalent to those in FIG. 3, and thus repeated explanation thereof is omitted for brevity.

After the input unit 110 of the hexahedral mesh generator has loaded the analysis model generation target (step S301), the shape decomposition part extracting module 150 loads an existing analysis model from the existing analysis model database 140 (S1702).

In regard to the loaded existing analysis model, the shape decomposition part extracting module 150 checks whether a shape decomposition part has already been extracted or not (S1703). If no post-decomposition shape data corresponding to the loaded existing analysis model has been stored in the existing analysis model database 140, it means that no shape decomposition part has been extracted from the analysis model.

For such an existing analysis model from which no shape decomposition part has been extracted, the shape decomposition part extracting module 150 performs the extraction of a shape decomposition part, generates the shape decomposition part data (S1705), and stores the generated shape decomposition part data in the shape decomposition part database 1604 (S1706).

In contrast, for an existing analysis model from which a shape decomposition part has already been extracted, the shape decomposition part extracting module 150 acquires the shape decomposition part by loading the shape decomposition part data corresponding to the analysis model from the shape decomposition part database 1604 (S1704).

The shape decomposition part extracting module 150 executes the processing from the step S1702 to the step S1706 or S1704 for every analysis model stored in the existing analysis model database 140 and thereby acquires the shape decomposition parts of all the existing analysis models (S1707).

Thereafter, the hexahedral mesh generator executes steps equivalent to the steps S303-S308 of the process shown in FIG. 3.

In the configuration example shown in FIG. 16, the shape decomposition part data stored in the shape decomposition part database 1604 can be reused, and thus the need of extracting the shape decomposition parts from the existing analysis model database 140 each time is eliminated. Consequently, the process executed by the hexahedral mesh generator can be speeded up.

As described above, according to this embodiment of the present invention, the shape decomposition parts already acquired in previous construction of analysis models are extracted. In the process for generating a new analysis model, the extracted shape decomposition parts can be reused. Therefore, the hexahedral mesh generator in accordance with this embodiment is capable of saving the labor of the work for the shape decomposition (needing a large number of steps or man-hours for the hexahedral mesh generation) and realizing efficient construction of analysis models.

Incidentally, while the embodiment described above is one suitable for the implementation of the present invention, the form of the implementation of the present invention is not restricted to the above embodiment but can be modified in various ways within the extent not changing the subject matter of the invention.

What is claimed is:

1. A hexahedral mesh generator which is connected to an output device, receives data of an analysis model generation target inputted thereto, and makes an analysis model by generating hexahedral mesh for the analysis model generation target, comprising:
an existing analysis model database which stores data of shapes of existing analysis models before undergoing shape decomposition for the generation of hexahedral mesh and data of shapes of the existing analysis models after undergoing the shape decomposition;
a shape decomposition part extracting module which compares the shape of each existing analysis model before the shape decomposition with the shape of the existing analysis model after the shape decomposition and thereby extracts a shape decomposition part as a part of the existing analysis model where the shape decomposition was executed;
a shape comparison module which compares the shape of each shape decomposition part with the shape of the analysis model generation target and thereby checks whether or not the shape of the shape decomposition part coincides with at least part of the shape of the analysis model generation target;
a coinciding shape decomposition part display and selection module which displays a list of the shape decomposition parts found by the shape comparison module to coincide with at least part of the analysis model generation target on the output device, receives selection of one or more shape decomposition parts from the list by the user of the hexahedral mesh generator, and outputs data of the selected shape decomposition parts;
a shape decomposition module which decomposes the shape of the analysis model generation target in the same way as the shape decomposition parts outputted by the coinciding shape decomposition part display and selection module; and
a hexahedral mesh generating module which generates the hexahedral mesh for the analysis model generation target after undergoing the shape decomposition by the shape decomposition module.

2. The hexahedral mesh generator according to claim 1, wherein the shape decomposition part extracting module compares the shape of the existing analysis model before the shape decomposition with the shape of the existing analysis model after the shape decomposition, recognizes added faces in the existing analysis model after the shape decomposition as cut surfaces, and extracts a group of faces including or adjoining the cut surfaces as the shape decomposition part.

3. The hexahedral mesh generator according to claim 1, wherein the shape comparison module generates an adjacency matrix representing the connective relationship among faces of the analysis model generation target and an adjacency matrix representing the connective relationship among faces of the shape decomposition part and makes the check on whether the shape decomposition part coincides with at least part of the analysis model generation target or not by replacing rows and columns of the adjacency matrix of the analysis model generation target and comparing the transformed adjacency matrix of the analysis model generation target with the adjacency matrix of the shape decomposition part.

4. The hexahedral mesh generator according to claim 1, further comprising a shape decomposition part database which stores data of the shape decomposition parts extracted by the shape decomposition part extracting module.

\* \* \* \* \*